United States Patent
Lai et al.

(10) Patent No.: US 7,183,607 B1
(45) Date of Patent: Feb. 27, 2007

(54) NON-VOLATILE MEMORY STRUCTURE

(75) Inventors: Liang-Chuan Lai, Hsinchu County (TW); Pin-Yao Wang, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 11/308,621

(22) Filed: Apr. 13, 2006

(30) Foreign Application Priority Data

Jan. 9, 2006 (TW) .............................. 95100724 A (51) Int. Cl.
*H01L 29/788* (2006.01)
(52) U.S. Cl. ................. 257/316; 438/258; 257/E27.103
(58) Field of Classification Search ........ 438/257–267; 257/316–317, 321, E27.103
See application file for complete search history.

(56) References Cited

U.S. PATENT DOCUMENTS 6,218,689 B1 * 4/2001 Chang et al. ............... 257/288
2002/0098651 A1 * 7/2002 Yim et al. .................. 438/258
2005/0035396 A1 * 2/2005 Yaegashi .................... 257/315
2006/0040447 A1 * 2/2006 Violette et al. ............. 438/257

* cited by examiner

Primary Examiner—Richard A. Booth
(74) Attorney, Agent, or Firm—Jianq Chyun IP Office (57) ABSTRACT

A non-volatile memory structure including a substrate, a first memory cell row, a first source/drain region, and a second source/drain region is described. The first memory cell row is disposed on the substrate and includes a plurality of memory cells, two select gate structures, and a plurality of doped regions. The select gate structures are respectively disposed on the substrate at one side of the outmost memory cell among the memory cells, and the select gates have a tapered corner at one side far from the memory cells. The doped regions are respectively disposed in the substrate between two memory cells as well as in the substrate between the memory cells and the select gate structures. The first and the second source/drain regions are respectively disposed in the substrate at both sides of the first memory cell row.

10 Claims, 7 Drawing Sheets

NON-VOLATILE MEMORY STRUCTURE

CROSS-REFERENCE TO RELATED APPLICATION

This application claims the priority benefit of Taiwan application serial no. 95100724, filed on Jan. 9, 2006. All disclosure of the Taiwan application is incorporated herein by reference.

BACKGROUND OF THE INVENTION

1. Field of Invention

The present invention relates to a memory structure. More particularly, the present invention relates to a non-volatile memory structure and a fabricating method thereof.

2. Description of Related Art

Flash memory in a non-volatile memory has become one of the research mainstreams in the field due to its fast and time-saving operating mode and lower cost advantage. A typical flash memory device is mainly constituted by a floating gate and a control gate. The control gate is directly disposed on the floating gate and is isolated from the floating gate by a dielectric layer, while the floating gate and the substrate are isolated by a tunneling oxide layer.

At present, flash memory arrays commonly used in the field include a NOR-type array structure type and a NAND-type array structure type. In the NAND-type array flash memory structure, various memory cells are connected in series so as to provide a superior integrated density and area utilization compared with the NOR-type array flash memory, and it has been widely used in various electronic products.

However, as for the NAND-type array flash memory structure, when forming a contact window connected to the source/drain region, short circuits of the contact window or the outmost select gate in the memory cell row often occur, thereby reducing the product yield.

SUMMARY OF THE INVENTION

In view of the above, an object of the invention is to provide a non-volatile memory structure with greater process tolerance.

Another object of the invention is to provide a method for fabricating the non-volatile memory structure, so as to prevent short circuits of the contact window and the select gate.

Yet another object of the invention is to provide a method for fabricating the non-volatile memory structure, so as to effectively improve the yield of the non-volatile memory device.

The invention provides a non-volatile memory structure, which includes a substrate, a first memory cell row, a first source/drain region, and a second source/drain region. The first memory cell row is disposed on the substrate and includes a plurality of memory cells, two select gate structures, and a plurality of doped regions. The memory cells are connected in series on the substrate. The two select gate structures are respectively disposed on the substrate at one side of the outmost memory cell among the memory cells. Each of the select gate structures has a tapered corner at one side far from the memory cells. The doped regions are respectively disposed in the substrate between two memory cells and in the substrate between the memory cells and the select gate structures. The first and second source/drain regions are respectively disposed in the substrate at both sides of the first memory cell row.

According to a preferred embodiment of the invention, in the above-mentioned non-volatile memory structure, the select gate structure sequentially includes a first dielectric layer, a select gate, and a cap layer from the substrate.

According to a preferred embodiment of the invention, in the aforementioned non-volatile memory structure, the select gate structure further includes a second dielectric layer, wherein the second dielectric layer does not completely isolate the upper and lower parts of the select gate.

According to a preferred embodiment of the invention, in the non-volatile memory structure, the material of the second dielectric layer is, for example, silicon oxide.

According to a preferred embodiment of the invention, in the above-mentioned non-volatile memory structure, the material of the select gate includes doped poly-silicon.

According to a preferred embodiment of the invention, in the aforementioned non-volatile memory structure, the material of the first dielectric layer is, for example, silicon oxide.

According to a preferred embodiment of the invention, in the aforementioned non-volatile memory structure, the material of the cap layer is, for example, silicon oxide.

According to a preferred embodiment of the invention, the foregoing non-volatile memory structure further includes spacers disposed on the sidewalls of the memory cells and the two select gate structures.

According to a preferred embodiment of the invention, in the above-mentioned non-volatile memory structure, the material of the spacer is, for example, silicon nitride.

According to a preferred embodiment of the invention, the aforementioned non-volatile memory structure further includes a second memory cell row, a second source/drain region, and a third doped region. The second memory cell row is disposed on the substrate and has the same structure as the first memory cell row. The second source/drain region and the third doped region are respectively disposed in the substrate at both sides of the second memory cell row. The second source/drain region is shared by the first and second memory cell rows.

The present invention provides a method for fabricating the non-volatile memory structure. First of all, a substrate is provided, which has a first dielectric layer, a first conductive layer, and a second dielectric layer sequentially formed thereon. Then, a part of the second dielectric layer is removed to form a first opening that has both ends with a select gate region respectively. The two select gate regions are spaced by a distance. The select gate region is constituted by a region with the second dielectric layer and a region without the second dielectric layer. Afterward, a second conductive layer is formed on the substrate and covers the second dielectric layer, wherein the second conductive layer has a tapered corner in the select gate region. A cap layer is formed on the second conductive layer. Then, the cap layer, the second conductive layer, the second dielectric layer, and the first conductive layer at one side of the select gate region are patterned to form a plurality of gate structures. Next, the cap layer, the second conductive layer, the second dielectric layer and the first conductive layer between two adjacent select gate regions are removed sequentially, thus forming a select gate structure in each select gate region. After that, a doped region is respectively formed in the substrate between the gate structures, between the select gate structures, and between the gate structures and the select gate structures.

According to a preferred embodiment of the invention, the above-mentioned method for fabricating the non-volatile memory structure further includes forming a third conductive layer on the second dielectric layer, and removing a part of the third conductive layer before removing a part of the second dielectric layer.

According to a preferred embodiment of the invention, the above-mentioned method for fabricating the non-volatile memory structure further includes forming a third dielectric layer on the substrate to cover the gate structures and the select gate structures.

According to a preferred embodiment of the invention, the above-mentioned method for fabricating the non-volatile memory structure further includes forming a contact window in the third dielectric layer after the third dielectric layer is formed on the substrate, wherein the contact window is connected to the doped region between two adjacent select gate structures.

According to a preferred embodiment of the invention, in the aforementioned method for fabricating the non-volatile memory structure, the method for forming a contact window in the third dielectric layer is, for example, first forming a second opening in the third dielectric layer to expose the doped region between two adjacent select gate structures. Then, a third conductive layer is formed on the third dielectric layer, and the third conductive layer fills up the second opening. After that, the third conductive layer outside the second opening is removed.

According to a preferred embodiment of the invention, in the aforementioned method for fabricating the non-volatile memory structure, the method for removing the third conductive layer outside the second opening is, for example, chemical mechanical polishing.

According to a preferred embodiment of the invention, the above-mentioned method for fabricating the non-volatile memory structure further includes forming spacers on the sidewalls of the gate structures and the select gate structures.

According to a preferred embodiment of the invention, in the foregoing method for fabricating the non-volatile memory structure, the method for forming spacers is, for example, first forming a conformal fourth dielectric layer on the substrate to cover the gate structures and the select gate structures. Then, the fourth dielectric layer is etched back.

According to a preferred embodiment of the invention, in the foregoing method for fabricating the non-volatile memory structure, the method for etching back the fourth dielectric layer is, for example, dry etching.

The invention provides a method for fabricating the non-volatile memory structure. First, a substrate is provided, which has a first dielectric layer, a first conductive layer, and a second dielectric layer sequentially formed thereon. Then, a part of the second dielectric layer is removed to form an opening with both ends having a select gate region respectively. The two select gate regions are spaced by a distance. The select gate region is constituted by a region with the second dielectric layer and a region without the second dielectric layer. Afterward, a second conductive layer is formed on the substrate and covers the second dielectric layer, wherein the second conductive layer has a tapered corner in the select gate region. Then, a cap layer is formed on the second conductive layer. The cap layer, the second conductive layer, the second dielectric layer, and the first conductive layer at one side of the select gate region are patterned to form a plurality of gate structures. After that, a part of the cap layer, the second conductive layer, and the first conductive layer at the other side of the select gate region are removed to form the select gate structures in the select gate region. Then, a doped region is respectively formed in the substrate between the gate structures, at both sides of the select gate structures, and between the gate structures and the select gate structures.

According to a preferred embodiment of the invention, the aforementioned method for fabricating the non-volatile memory structure further includes forming spacers on the sidewalls of the gate structures and the select gate structures.

According to a preferred embodiment of the invention, in the above-mentioned method for fabricating the non-volatile memory structure, the method for forming spacers is, for example, forming a conformal fourth dielectric layer on the substrate to cover the gate structures and the select gate structures. And then, the fourth dielectric layer is etched back.

According to a preferred embodiment of the invention, in the above-mentioned method for fabricating the non-volatile memory structure, the method for etching back the fourth dielectric layer includes dry etching.

In the non-volatile memory structure provided by the invention, as the formed select gate has a tapered corner, the distance between the select gate and the contact window is enlarged to prevent short circuits of the contact window and the select gate, thereby effectively improving the yield of the non-volatile memory device. Besides, the method for fabricating non-volatile memory structure of the invention uses spacers as a self-aligned etching mask during the following process of forming the contact window, so it can effectively improve the process tolerance.

In order to make the aforementioned and other objects, features, and advantages of the present invention comprehensible, preferred embodiments accompanied with figures are described in detail below.

DESCRIPTION OF EMBODIMENTS

FIGS. 1A~1F are the sectional views of the manufacturing flow of the non-volatile memory structure according to one embodiment of the invention.

Figure 1A:
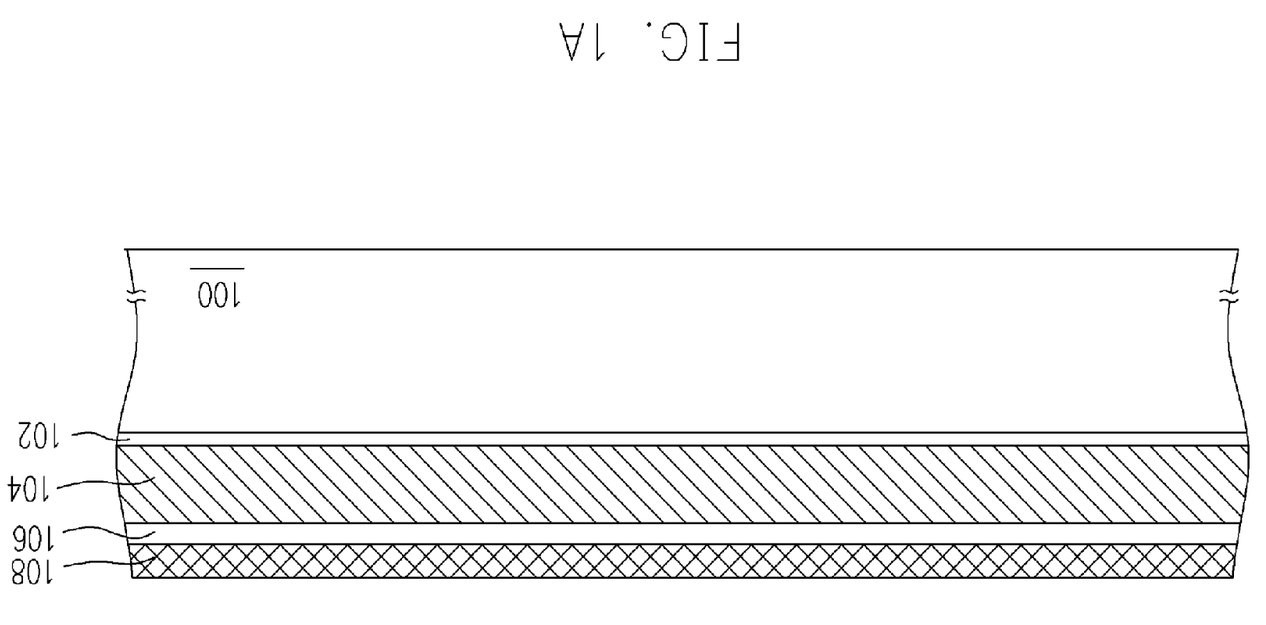
FIGS. 1A~1F are the sectional views of the manufacturing flow of the non-volatile memory structure according to an embodiment of the invention.

First, referring to FIG. 1A, a substrate 100 is provided, which has a dielectric layer 102 and a conductive layer (not shown) sequentially formed thereon. The material of the dielectric layer 102 is, for example, silicon oxide, and the method for forming the dielectric layer 102 is, for example, thermal oxidation. The material of the conductive layer is, for example, doped poly-silicon, and the method for forming the conductive layer is, for example, chemical vapor deposition by means of in-situ doping. Next, the conductive layer is patterned to form a plurality of strip conductive layers 104 arranged in parallel. The strip conductive layers 104 extend in a first direction (not shown), and serve as a floating gate of the memory cell. Then, a dielectric layer 106 is formed on the substrate 100 to cover the strip conductive layers 104. The dielectric layer 106 is, for example, a composite dielectric layer of silicon oxide, silicon nitride, and silicon oxide. The method for forming the dielectric layer 106 is, for example, forming the silicon oxide layer, silicon nitride layer, and silicon oxide layer sequentially by chemical vapor deposition.

Moreover, a conductive layer 108 is optionally formed on the dielectric layer 106. The material of the conductive layer 108 is, for example, doped poly-silicon, and the method for forming the conductive layer 108 is, for example, chemical vapor deposition by means of in-situ doping. In the following patterning process, as the conductive layer 108 is formed on the dielectric layer 106, the mask layer is not directly formed on the dielectric layer 106, so as to avoid damaging the dielectric layer 106 when removing the mask layer used in the patterning process.

Figure 1B:
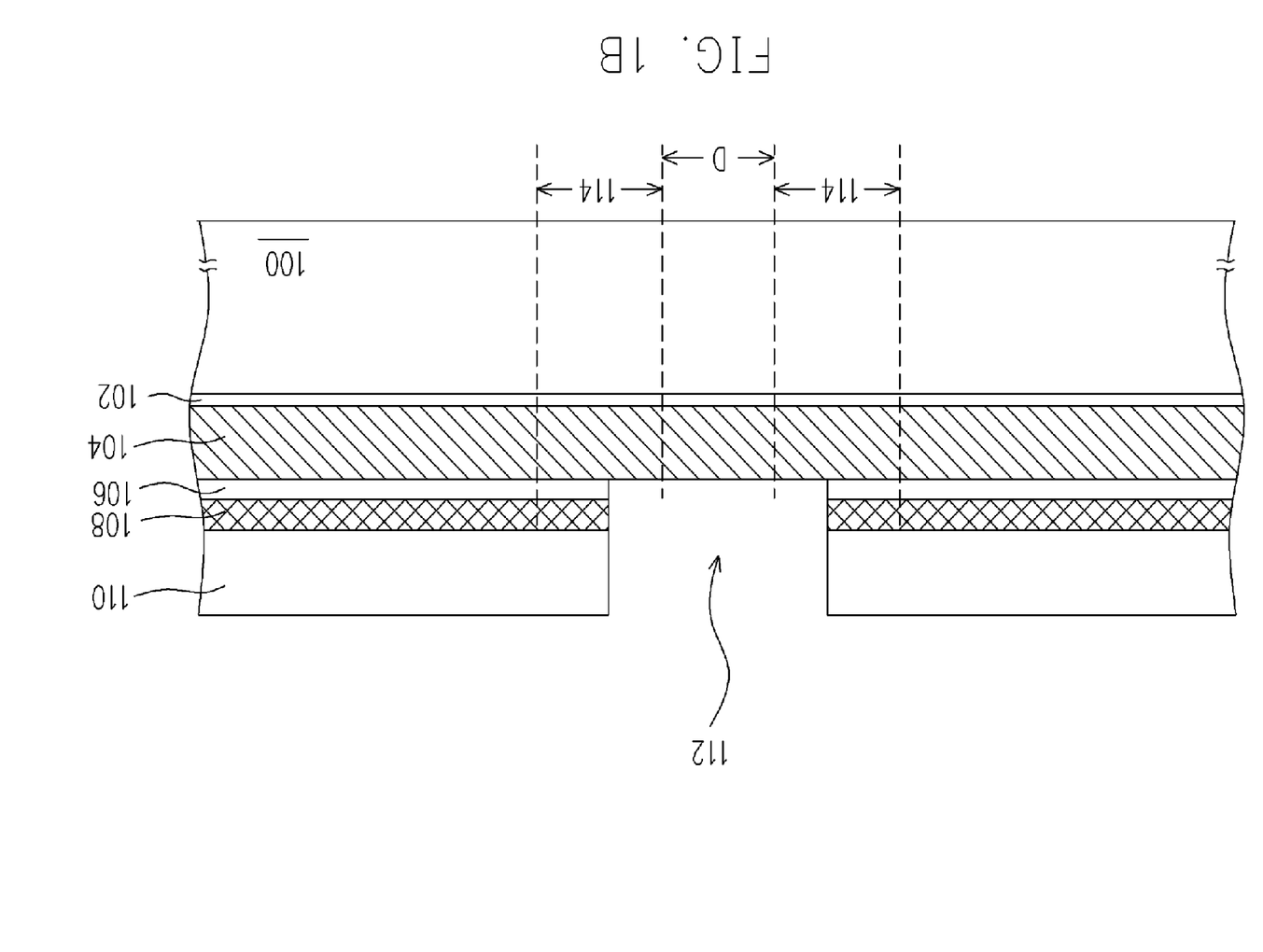

Then, referring to FIG. 1B, a patterned mask layer 110 is formed on the conductive layer 108. The material of the patterned mask layer 110 is, for example, a photoresist material. The patterned mask layer 110 is used as a mask for sequentially removing a part of the conductive layer 108 and the dielectric layer 106, and exposing the strip conductive layers 104 to form an opening 112 with both ends having a select gate region 114 respectively. The select gate region 114 is constituted by a region with the dielectric layer 106 and a region without the dielectric layer 106 in the opening 112. The two select gate regions 114 are spaced by a distance D. The region between the two select gate regions 114 is predetermined as a source/drain region and a contact window in the following process. The method for removing the conductive layer 108 and the dielectric layer 106 is, for example, dry etching.

Figure 1C:
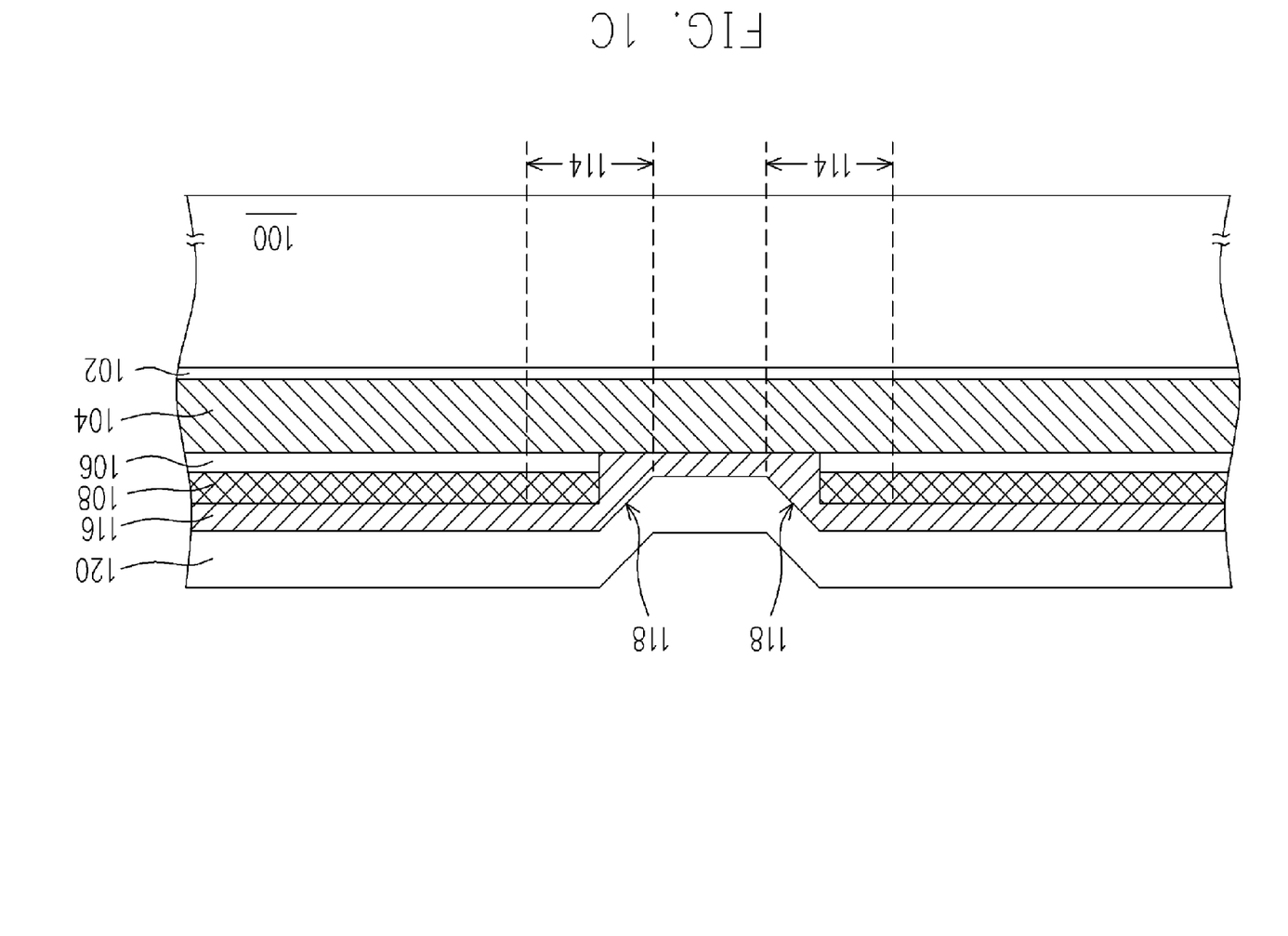

Afterward, referring to FIG. 1C, the patterned mask layer 110 is removed. A conductive layer 116 is formed on the substrate 100 as a control gate. The conductive layer 116 covers the conductive layer 108 and the conductive layers in stripes 104, wherein the conductive layer 116 has a tapered corner 118 in the select gate region 114. It should be noted that the so-called tapered corner 118 herein is not an angle, but an inclined part of the conductive layer 116. In the embodiment, the reason for forming the tapered corner 118 lies in that the opening 112 formed in the previous step causes a height difference between the conductive layer 116 and the strip conductive layers 104. Therefore, the inclined part, i.e., the tapered corner 118, is formed when the conductive layer 116 is formed by chemical vapor deposition.

Next, a cap layer 120 is formed on the conductive layer 116. The material of the cap layer 120 is, for example, silicon oxide. The method for forming the cap layer 120 is, for example, chemical vapor deposition with tetraethoxy silane as the reacting gas.

Figure 1D:
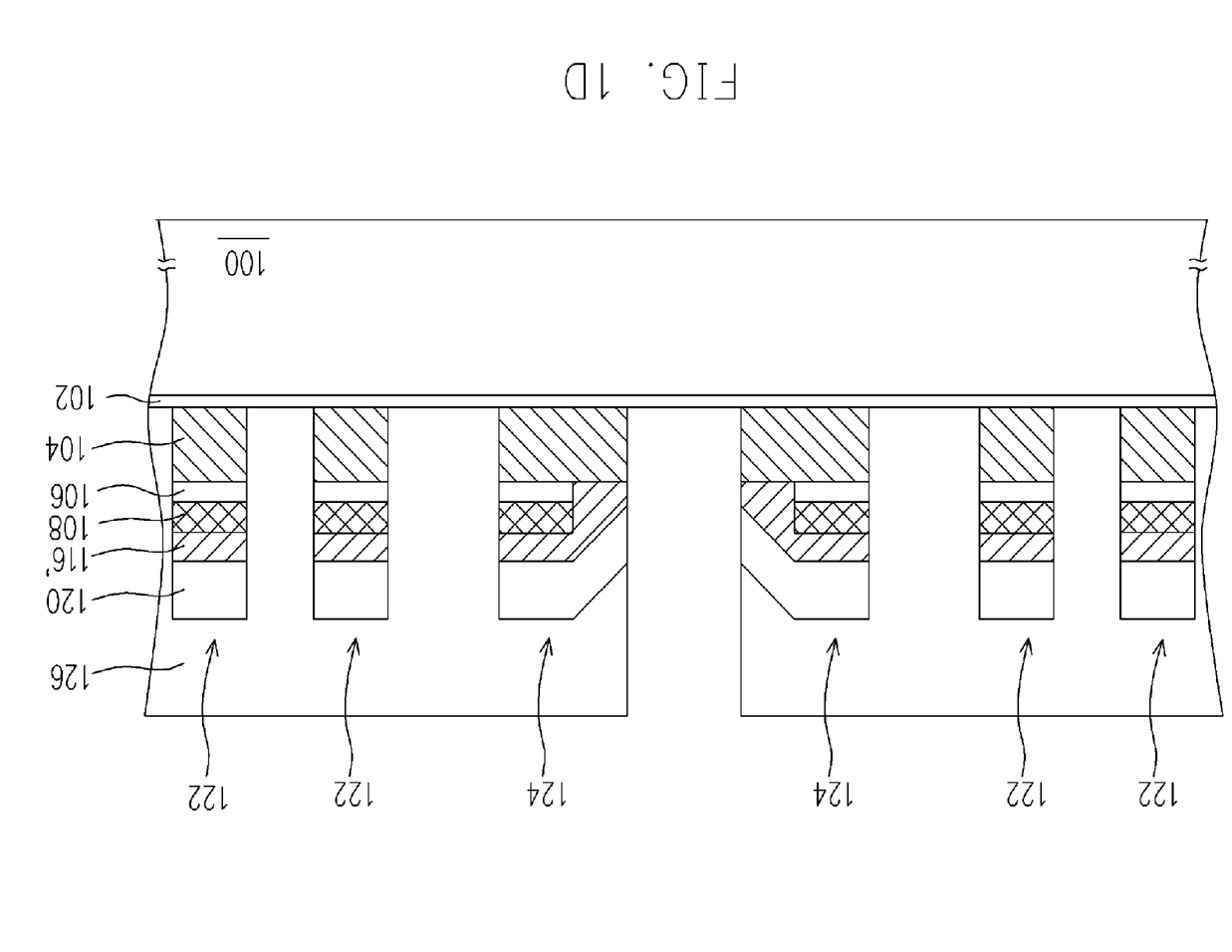

Then, referring to FIG. 1D, the cap layer 120, conductive layer 116, conductive layer 108, dielectric layer 106, and strip conductive layers 104 at both sides of the select gate region 114 are patterned to form a plurality of gate structures 122. A plurality of strip conductive layers 116' arranged in parallel are formed after the conductive layer 116 is patterned. The second strip conductive layers 116' extend in a second direction (not shown), wherein the first and the second direction are crossed with each other. The method for forming the gate structure 122 is, for example, taking the patterned photoresist layer (not shown) as a mask to sequentially remove a part of the cap layer 120, conductive layer 116, conductive layer 108, dielectric layer 106, and strip conductive layers 104 by dry etching. And then the patterned photoresist layer is removed.

After that, the cap layer 120, strip conductive layers 116', and strip conductive layers 104 between two select gate regions 114 are removed sequentially, so as to form select gate structures 124 in each of the select gate regions 114. The method for forming the select gate structures 124 is, for example, first forming a patterned photoresist layer 126 on the substrate 100. And then, the photoresist layer 126 is taken as a mask for being applied in the dry etching of the exposed cap layer 120, strip conductive layers 116', and strip conductive layers 104.

Figure 1E:
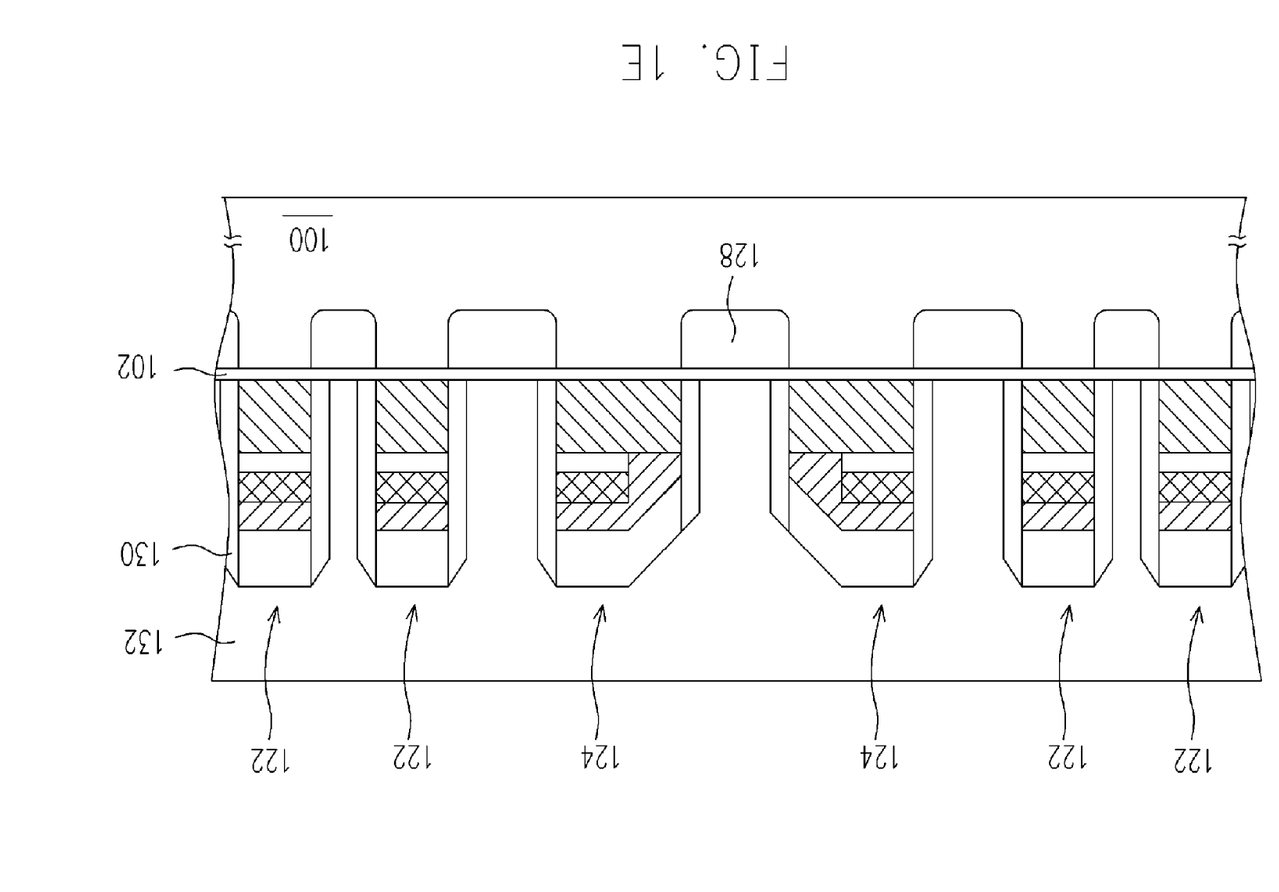

Then, referring to FIG. 1E, the patterned photoresist layer 126 is removed. Next, a doped region 128 is respectively formed in the substrate 100 between the gate structures 122, between the select gate structures 124, and between the gate structures 122 and the select gate structures 124 by means of, for example, ion-implantation.

Then, spacers 130 are formed on the sidewalls of the gate structures 122 and the select gate structures 124. The method for forming the spacer 130 is, for example, first forming a conformal silicon nitride dielectric layer 128 on the substrate 100 to cover the gate structures 122 and the select gate structures 124, and then etching back the silicon nitride dielectric layer 128. The method for etching back the silicon nitride dielectric layer 128 is, for example, dry etching.

Next, a dielectric layer 132 is formed on the substrate 100 to cover the gate structures 122 and the select gate structures 124. The material of the dielectric layer 132 is, for example, silicon oxide, and the method for forming the dielectric layer 132 is, for example, chemical vapor deposition.

Figure 1F:
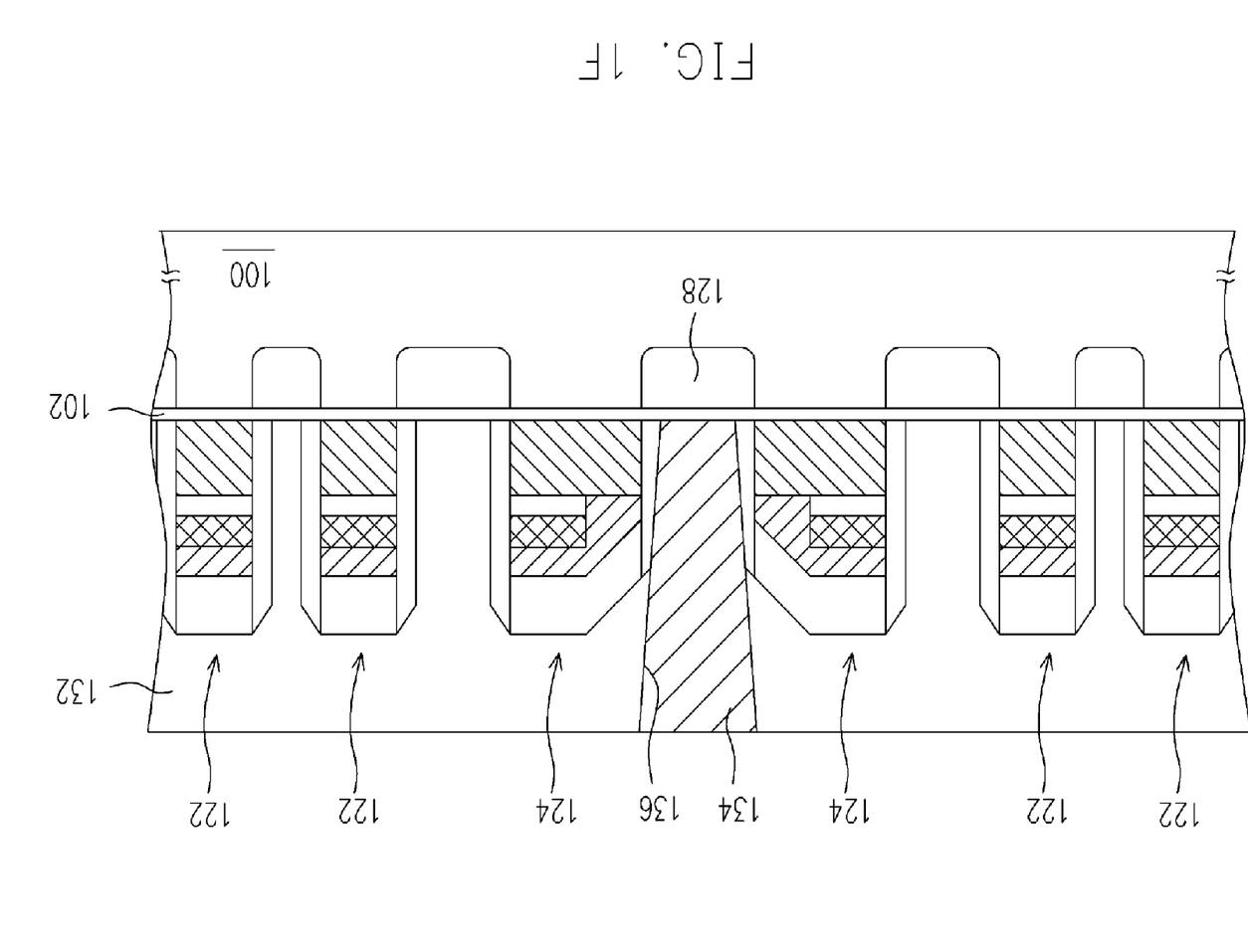

Then, referring to FIG. 1F, a contact window 134 is formed in the dielectric layer 132, and is connected to the doped region 128 between two adjacent select gate structures 124. The material of the contact window 134 is, for example, metal such as tungsten or other suitable materials. The method for forming the contact window 134 is, for example, first forming an opening 136 in the dielectric layer 132 to expose the doped region 128 between two adjacent select gate structures 124. Next, a conductive layer (not shown) is formed on the dielectric layer 132 and fills up the opening 136. Then, the conductive layer outside the opening 136 is removed to form the contact window 134. The method for removing the conductive layer outside the opening 136 is, for example, chemical mechanical polishing.

As the conductive layer 116 has a tapered corner 118 in the select gate region 114, the cap layer 120 formed on the tapered corner 118 also has an inclined part. Therefore, when forming the contact window 134, the inclined part of the cap layer 120 can enlarge distance between the contact window 134 and the conductive layers 116, 108, and 104, thus preventing short circuits of the contact window 134 and the conductive layers 116, 108, and 104, thereby effectively improving the yield of the memory device.

Moreover, during the process of forming the contact window 134, the spacer 130 is used as a self-aligned etching mask for forming the opening 136, so it has a greater process tolerance.

Figure 2:
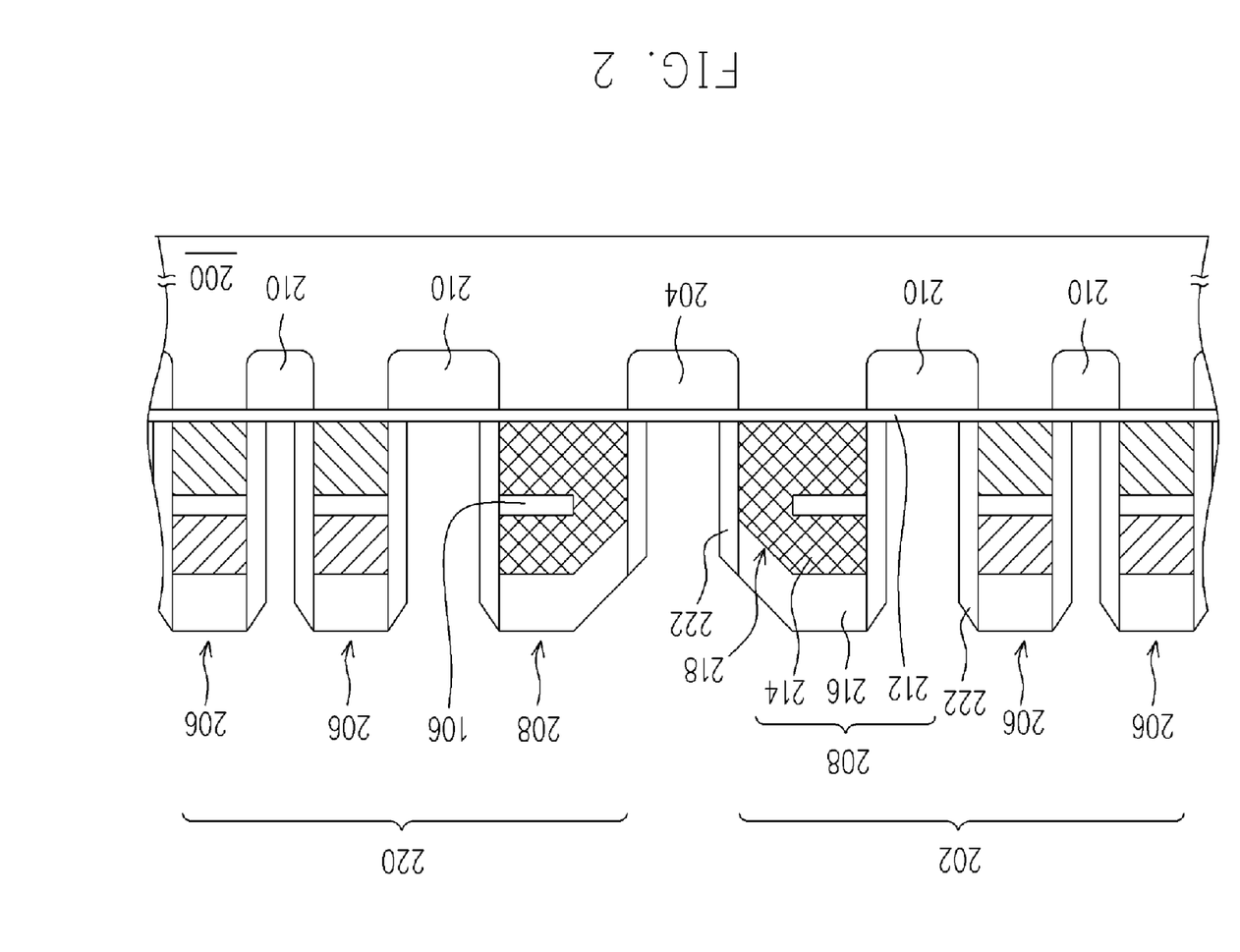
FIG. 2 is the sectional view of the non-volatile memory structure according to an embodiment of the invention.

FIG. 2 is the sectional view of the non-volatile memory structure according to an embodiment of the invention.

Referring to FIG. 2, the non-volatile memory structure of the invention includes a substrate 200, a memory cell row 202, and a source/drain region 204. The memory cell row 202 is disposed on the substrate 200, and the memory cell row 202 includes a plurality of memory cells 206, select gate structures 208, and a plurality of doped regions 210. The memory cells 206 are connected in series on the substrate 200. The select gate structures 208 are respectively disposed on the substrate 200 at one side of the outmost memory cell 206 among the memory cells 206. Each of the select gate structures 208 sequentially includes a dielectric layer 212, a select gate 214, and a cap layer 216 from the substrate 200. Each of the select gates 214 has a tapered corner 218 at one side far from the memory cell 206. It should be noted that the so-called tapered corner 218 is not an angle, but is an inclined part of the select gate 214. The doped regions 210 are respectively disposed in the substrate 200 between two memory cells 206 and between the memory cells 206 and the select gates 208. The source/drain regions 204 are respectively disposed in the substrate at both sides of the memory cell row 202. The material of the select gate 214 is, for example, doped poly-silicon. The material of the dielectric layer 212 is, for example, silicon oxide. And the material of the cap layer 216 is, for example, silicon oxide.

Furthermore, in the non-volatile memory structure of the invention, another memory cell row 220 can be further disposed on the substrate 200. The memory cell row 220 has the same structure as the memory cell row 202, and a source/drain region 204 is also disposed in the substrate 200 at both sides of the memory cell row 220. The source/drain region 216 between the memory cell row 202 and the memory cell row 220 is shared by the two memory cell rows 202 and 220. In the preferred embodiment of the invention, the select gate structures 208 can further include a part of the dielectric layer 106 for isolating the floating gate and the control gate in the memory cell row 202 or 220. However, the part of dielectric layer 106 does not completely isolate the upper and lower parts of the select gates 214.

Moreover, in the structure of the non-volatile memory structure of the invention, spacers 222 can be further disposed on the sidewalls of the memory cells 206 and the select gate structures 208. The material of the spacer 222 is, for example, silicon nitride.

The materials and detailed fabricating methods for various components of the non-volatile memory structure have been illustrated above and will not be described in detail herein.

As the select gate 214 has a tapered corner 218, the cap layer 216 disposed on the tapered corner 218 also has an inclined part. As such, the inclined part of the cap layer 216 can enlarge of the distance between the select gate 214 and the contact window, thereby preventing short circuits of the contact window and the select gate.

In view of the above, the present invention at least has the following advantages.

1. In the non-volatile memory structure provided by the invention, as the select gate has a tapered corner, the distance between the select gate and the contact window can be enlarged, thereby avoiding short circuits of the contact window and the select gate.

2. The method for fabricating the non-volatile memory structure provided by the invention employs spacers as a self-aligned etching mask during the process of forming the contact window, so it has a greater process tolerance.

3. The method for fabricating the non-volatile memory structure provided by the invention can effectively improve the yield of the non-volatile memory.

Though the present invention has been disclosed above by the preferred embodiments, it is not intended to limit the invention. Anybody skilled in the art can make some modifications and variations without departing from the spirit and scope of the invention. Therefore, the protecting range of the invention falls in the appended claims.

What is claimed is:

1. A non-volatile memory structure, comprising:
   a substrate;
   a fist memory cell row, disposed on the substrate, wherein the first memory cell row comprises:
   a plurality of memory cells, connected in series on the substrate; two select gate structures, respectively disposed on the substrate at one side of the outmost memory cell among the memory cells, wherein each of the select gate structures has a tapered corner at one side far from the memory cells; and
   a plurality of doped regions, respectively disposed in the substrate between two memory cells and in the substrate between the memory cells and the two select gate structures; and
   a first source/drain region and a second source/drain region, respectively disposed in the substrate at both sides of the first memory cell row.

2. The non-volatile memory structure of claim 1, wherein the select gate structure sequentially comprises a first dielectric layer, a select gate, and a cap layer from the substrate.

3. The non-volatile memory structure of claim 2, wherein the select gate structure further comprises a second dielectric layer that does not completely isolate the upper and lower parts of the select gate.

4. The non-volatile memory structure of claim 3, wherein the material of the second dielectric layer comprises silicon oxide.

5. The non-volatile memory structure of claim 2, wherein the material of the select gates comprises doped poly-silicon.

6. The non-volatile memory structure of claim 2, wherein the material of the first dielectric layer comprises silicon oxide.

7. The non-volatile memory structure of claim 2, wherein the material of the cap layer comprises silicon oxide.

8. The non-volatile memory structure of claim 1, further comprising spacers disposed on the sidewalls of the memory cells and the two select gate structures.

9. The non-volatile memory structure of claim 8, wherein the material of the spacers comprise silicon nitride.

10. The non-volatile memory structure of claim 1, further comprising:
   a second memory cell row, disposed on the substrate, wherein the second memory cell row has the same structure as the first memory cell row; and the second source/drain region and a third source/drain region respectively disposed in the substrate at both sides of the second memory cell row, wherein the first and second memory cell rows both share the second source/drain region.

* * * * *